US008853045B2

United States Patent
Soss

(10) Patent No.: US 8,853,045 B2
(45) Date of Patent: Oct. 7, 2014

(54) LOW CAPACITANCE PRECISION RESISTOR

(75) Inventor: Steven R. Soss, Monroe, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 275 days.

(21) Appl. No.: 13/282,224

(22) Filed: Oct. 26, 2011

(65) Prior Publication Data

US 2012/0038026 A1 Feb. 16, 2012

Related U.S. Application Data

(62) Division of application No. 12/683,770, filed on Jan. 7, 2010, now Pat. No. 8,071,457.

(51) Int. Cl.
| | |
|---|---|
| *H01L 21/20* | (2006.01) |
| *H01L 27/08* | (2006.01) |
| *H01L 29/8605* | (2006.01) |
| *H01L 49/02* | (2006.01) |

(52) U.S. Cl.
CPC ........ *H01L 27/0802* (2013.01); *H01L 29/8605* (2013.01); *H01L 28/20* (2013.01)
USPC ..... 438/382; 438/381; 257/536; 257/E27.016

(58) Field of Classification Search
CPC ..................... H01L 21/76237; H01L 27/0802; H01L 27/101; H01L 28/20; H01L 29/045; H01L 29/66439; H01L 29/8605
USPC .......... 438/381–385; 257/499, 528, 536–538, 257/904, E27.009, E27.016, E27.113, 257/E27.114
See application file for complete search history.

(56) References Cited

U.S. PATENT DOCUMENTS

| | | | |
|---|---|---|---|
| 3,359,462 | A | 12/1967 | Hans-Jurgen Schutze et al. |
| 3,813,585 | A | 5/1974 | Tarui et al. |
| 4,370,175 | A * | 1/1983 | Levatter .......................... 438/57 |
| 4,497,685 | A | 2/1985 | Soclof |
| 5,543,351 | A | 8/1996 | Hirai et al. |
| 6,746,910 | B2 | 6/2004 | Hsu et al. |
| 7,242,074 | B2 * | 7/2007 | Erickson et al. .............. 257/532 |
| 7,375,000 | B2 | 5/2008 | Nowak et al. |

OTHER PUBLICATIONS

US Office Action for corresponding U.S. Appl. No. 12/683,770, dated Feb. 7, 2011.

* cited by examiner

*Primary Examiner* — Leonard Chang
(74) *Attorney, Agent, or Firm* — Dithavong & Steiner, P.C.

(57) ABSTRACT

A precision low capacitance resistor is formed, e.g., in a bulk substrate. An embodiment includes forming a source/drain region on a substrate, patterning a portion of the source/drain region to form segments, etching the segments to substantially separate an upper section of each segment from a lower section of each segment, and filling the space between the segments with an insulating material. The resulting structure maintains electrical connection between the segments at end pads, but separates the resistor segments from the bottom substrate, thereby avoiding capacitive coupling with the substrate.

18 Claims, 3 Drawing Sheets

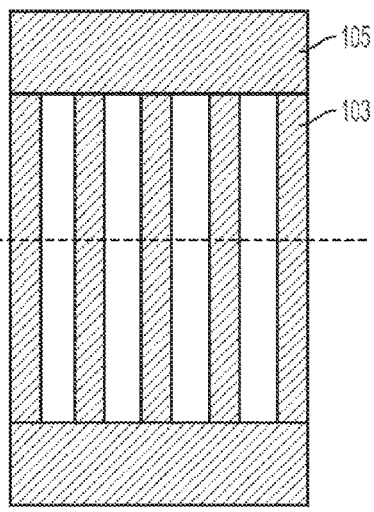
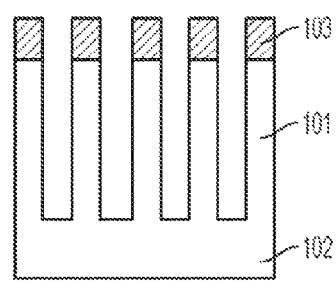
FIG. 1A  FIG. 1B
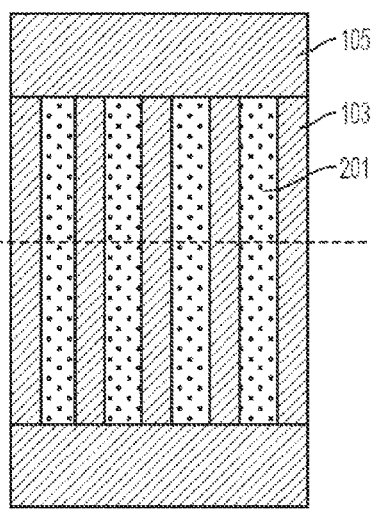
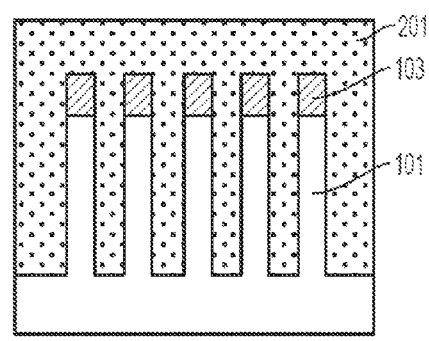
FIG. 2A  FIG. 2B

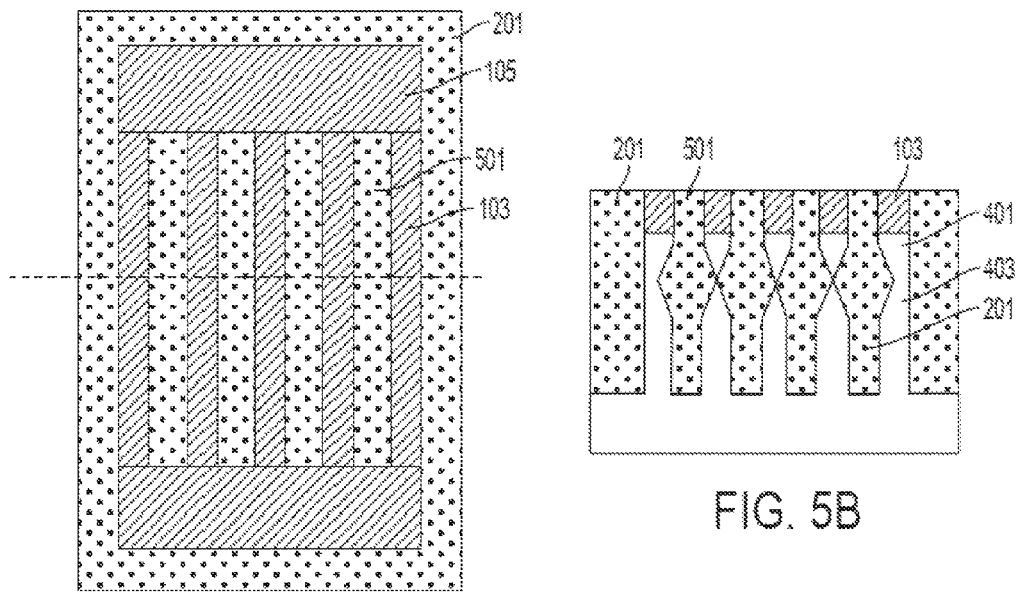
FIG. 5A
FIG. 5B
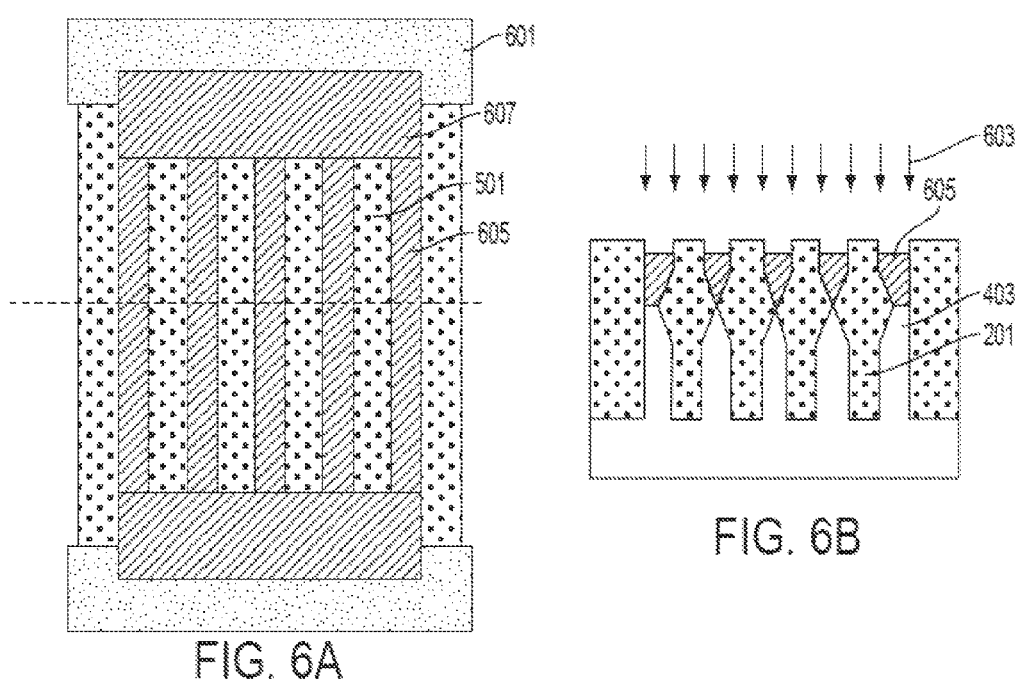
FIG. 6A
FIG. 6B

LOW CAPACITANCE PRECISION RESISTOR

CROSS-REFERENCE TO RELATED APPLICATION

The present application is a divisional application of U.S. Ser. No. 12/683,770, filed on Jan. 7, 2010, the entire contents of which are herein incorporated by reference.

TECHNICAL FIELD

The present disclosure relates to semiconductor devices with precision resistors. The present disclosure is particularly applicable to semiconductors with low capacitance precision resistors formed in a bulk silicon substrate.

BACKGROUND

With the vertical scaling of gate stacks and implementation of pre-metalized gates and replacement gates in semiconductor devices, the ability to pattern a precision resistor in the gate pattern is becoming extremely difficult. A precision resistor can be moved into the diffusion substrate. However, building the resistor into the bulk substrate carries a large capacitive penalty.

A need therefore exists for methodology enabling the formation of a low capacitance precision resistor in the bulk substrate, and for the resulting device.

SUMMARY

An aspect of the present disclosure is a semiconductor device comprising low capacitance resistor segments in a portion of the source/drain region of a substrate.

Another aspect of the present disclosure is a method of fabricating a resistor comprising low capacitance resistor segments in a portion of the source/drain region of a substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a resistor, the method comprising: forming a source/drain region on a substrate; patterning a portion of the source/drain region to form segments; etching the segments to substantially separate an upper section of each segment from a lower section of each segment; and filling the space between the segments with an insulating material.

Aspects of the present disclosure include forming the source/drain region on a silicon substrate, wherein the segments comprise silicon. Another aspect includes patterning the source/drain region to form silicon segments connected by a pad at each end. Other aspects include partially filling spaces between the silicon segments with an insulating material, e.g., an oxide, leaving a portion of each silicon segment exposed, and etching the exposed portion of the silicon segments. Further aspects include forming shallow trench isolation (STI) regions on the substrate, and partially filling the spaces between the silicon segments while forming the STI regions. Additional aspects include etching the exposed portion of the silicon segments by wet etching. Further aspects include masking the pads prior to etching, to maintain connection between the upper section and bottom section of each segment at each end. Another aspect includes converting the silicon segments to polycrystalline silicon, e.g., by implanting a dopant into the silicon segments to amorphize the silicon, and annealing the amorphized silicon. Other aspects include controlling a resistance value of the resistor by selecting a length of the silicon segments, the number of silicon segments, and/or the dopant implanted into the silicon segments.

Another aspect of the present disclosure is a semiconductor device comprising: a source/drain region on a substrate; resistor segments patterned in a portion of the source/drain region and electrically connected at each end by a pad, each resistor segment comprising a lower section, closest to the substrate, substantially separated from an upper section, further from the substrate.

Aspects include a semiconductor device including a substrate of silicon and the resistor segments being formed of silicon. Further aspects include an insulating material filling the spaces between the sections. Another aspect includes the upper and lower sections being substantially separated by wet etching the silicon resistor segments. An additional aspect includes a dopant implanted in the silicon resistor segments. Other aspects include a semiconductor device wherein the silicon is polycrystalline, and the insulating material is an oxide. Further aspects include the number of resister segments ranging from 1 to 3.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 6 schematically illustrate sequential steps of a method in accordance with an exemplary embodiment, with FIGS. 1A through 6A illustrating top views, and 1B through 6B illustrating cross-sectional views.

DETAILED DESCRIPTION

Figure 3A:
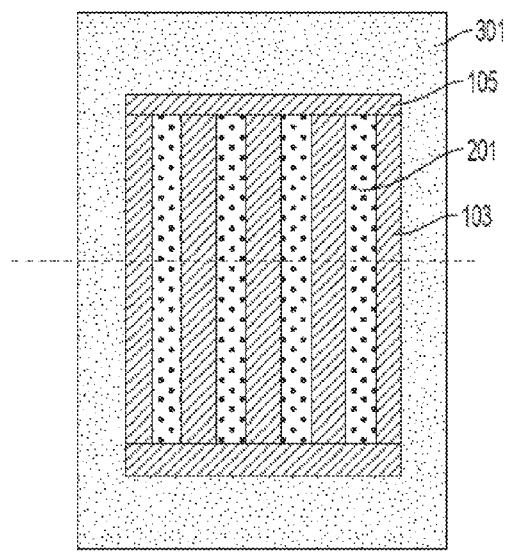

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the high capacitance problem attendant upon forming a precision resistor, e.g., in a bulk substrate. In accordance with embodiments of the present disclosure, resistor segments and end pads are formed on a substrate. The resistor segments are then substantially separated from the substrate. Consequently, the resistor segments are electrically connected to each other, but not capacitively coupled to the substrate.

Methodology in accordance with embodiments of the present disclosure includes forming resistor segments in the source/drain regions of a substrate, and substantially separating the segments from the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

After completion of normal source/drain lithography a resistor structure is set to be a multiple of minimum source/drain widths. FIGS. 1A and 1B schematically illustrate a first step in the method of fabricating the resistor structure. As illustrated, multiple segments or fingers 101 are formed of silicon, in source/drain regions 102, each with a nitride cap 103. The fingers are connected at each end by a pad 105, which also includes a nitride cap. Trenches are formed between the fingers for shallow trench isolation (STI). Note that while FIGS. 1A and 1B illustrate the segments or finger structure as straight lines, the segments or fingers can be any form, e.g., an elongated form, rectangular, serpentine, or spiral. For example, the structure can be envisaged as a winding, i.e., a serpentine or spiral structure, in order to increase overall finger length.

STI processing proceeds, filling the trenches with a dielectric material 201, for example an oxide, as illustrated in FIGS. 2A and 2B. The dielectric material 201 may be polished back to the nitride cap via chemical mechanical polishing (CMP), as illustrated in FIG. 2A, or the STI processing may stop prior to CMP, as shown in FIG. 2B.

Figure 3B:
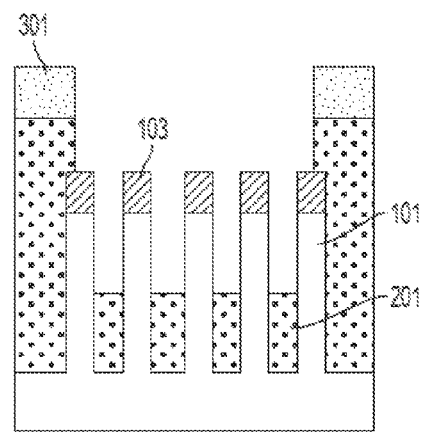

Adverting to FIGS. 3A and 3B, the resistor finger structure is partially re-opened. A mask 301 is formed over pads 105 and the resistor finger at each side of the structure. The dielectric 201 is then removed to the source/drain resistor depth level, part way down the resistor fingers.

Figure 4A:
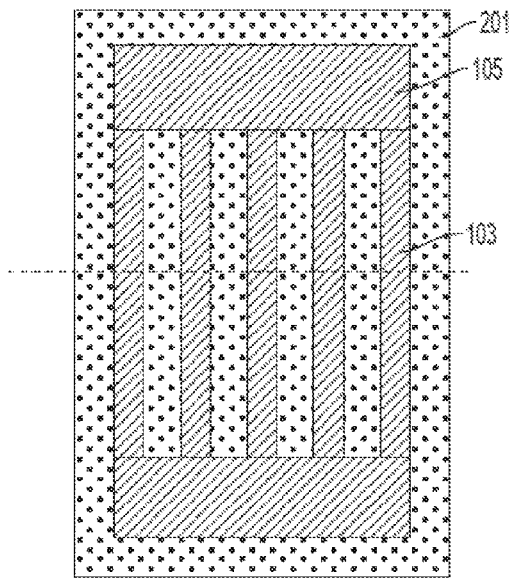
Figure 4B:
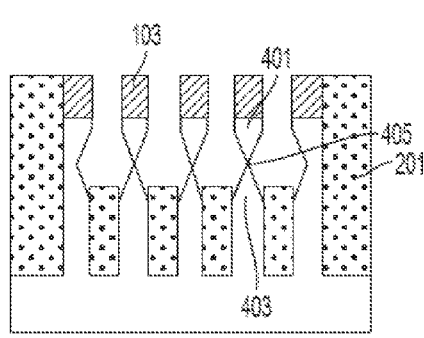

Using the remaining dielectric material 201 as a soft mask, the silicon of the resistor fingers 101 is etched using a wet-etch technique which is silicon-plane sensitive. Etchants, such as tetramethylammonium hydroxide (TMAH), ammonium hydroxide (NH4OH), and potassium hydroxide (KOH), may be used for etching the silicon. The resulting structure is illustrated in FIG. 4B. As shown, facets 401 and 403 are formed such that they "pinch off" at point 405, i.e., they substantially separate at point 405. Thus, horizontal bars, i.e., the resistor, become separated from the bottom substrate. Oxidation may also be used to consume silicon in the pinch region to complete the separation. Alternatively, facets 401 and 403 may remain slightly connected, as the formation of the facets may provide sufficient capacitive improvement. As illustrated in FIG. 4A, even when facets 401 are completely separated from facets 403, facets 401 remain connected to each other at end pads 105 under nitride cap 103.

Adverting to FIGS. 5A and 5B, the spaces between adjacent resistor segments (i.e., adjacent stacks of facet 401, facet 403, and nitride cap 103) are refilled with a dielectric material 501, such as an oxide. STI CMP is then implemented to polish dielectric 501 down to nitride cap 103.

The resistor structure is then implanted in a conventional manner to amorphize the silicon layer, which is then annealed to convert the silicon into polycrystalline. The polycrystalline exhibits an improved temperature coefficient of resistance (TCR) over the initial single crystal. The conversion of the silicon may alternatively be performed prior to formation of the semiconductor gate, or later during source/drain formation.

FIGS. 6A and 6B illustrate implantation of the resistor structure. Nitride cap 103 is removed, and a mask 601 is formed at each end of the resistor structure, leaving pads 105 and facets 401 exposed. The silicon at facets 401 and end pads 105 is implanted with a dopant 603, for example Boron or Borondifluoride ($BF_2$) or Phosphorus or Arsenic, at a dose of about 1E15 to 1E16 and with high energy, e.g., about 5 KeV to 10 KeV. The doped silicon is shown as facets 605 connected at each end by doped end pads 607. Electrical connection to the resistor is also accomplished at end pads 607. Particular resistance values of the resistor can be achieved through control of the dopant and the number and length of the fingers.

The embodiments of the present disclosure can achieve several technical effects, including porting of the resistor into the substrate for a bulk device without paying a capacitive penalty. The present disclosure enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A semiconductor device comprising:
a source/drain region in a substrate;
resistor segments and substrate segments patterned in a portion of the source/drain region, each resistor segment being above but substantially separated from a corresponding substrate segment, and the resistor segments being electrically connected at each end by a pad; and
an insulating material filling all spaces between the resistor segments, the substrate segments, and therebetween.

2. The semiconductor device according to claim 1, wherein the substrate is silicon and the resistor segments and substrate segments are formed of silicon.

3. The semiconductor device according to claim 2, wherein the resistor segments and substrate segments are substantially separated from each other by wet etching.

4. The semiconductor device according to claim 2, further comprising a dopant implanted in the silicon resistor segments.

5. The semiconductor device according to claim 4, wherein the silicon of the resistor segments is polycrystalline.

6. The semiconductor device according to claim 2, wherein the number of resister segments ranges from 1 to 3.

7. The semiconductor device according to claim 1, wherein the insulating material comprises an oxide.

8. The semiconductor device according to claim 1, wherein the resistor segments and substrate segments have facets that taper toward a point between the resistor segments and substrate segments.

9. The semiconductor device according to claim 4, wherein the dopant comprises boron, borondifluoride, phosphorus, or arsenic implanted at a dose of 1E15 to 1E16 with an energy of 5 keV to 10 keV.

10. The semiconductor device according to claim 2, wherein the substrate is single crystal silicon.

11. A semiconductor device comprising:
a single crystal silicon substrate;
a source/drain region in the substrate;
substrate segments patterned in a portion of the source/drain region, each having faceted sides tapered toward a point in a direction of an upper surface of the substrate;
resistor segments patterned in the portion of the source/drain region above the substrate segments, but separated therefrom, each having faceted sides tapered in a direction of a lower surface of the substrate toward the point; and
an insulating material filling all spaces between the resistor segments and the substrate segments, between the resistor segments, and between the substrate segments, wherein
a number of substrate segments equals a number of resistor segments, and
the resistor segments are electrically connected to each other at each end by a pad.

12. The semiconductor device according to claim 11, wherein the insulating material comprises an oxide.

13. The semiconductor device according to claim 11, wherein the resistor segments comprise polycrystalline silicon.

14. The semiconductor device according to claim 11, further comprising a dopant implanted in the resistor segments.

15. The semiconductor device according to claim 14, wherein the dopant comprises boron, borondifluoride, phosphorus, or arsenic implanted at a dose of 1E15 to 1E16 with an energy of 5 keV to 10 keV.

16. The semiconductor device according to claim 11, wherein the number of resister segments ranges from 1 to 3.

17. A semiconductor device comprising:
a single crystal silicon substrate;
a source/drain region in the substrate;
one to three substrate segments patterned in a portion of the source/drain region, each having faceted sides tapered toward a point in the direction of an upper surface of the substrate; and
resistor segments above the substrate segments, but separated or substantially separated therefrom, each having faceted sides tapered in a direction of a lower surface of the substrate toward the point; and
an oxide material filling all spaces between resistor segments and substrate segments, wherein
the number of resistor segments equals the number of substrate segments,
the resistor segments and substrate segments comprise polycrystalline silicon, and
the resistor segments are electrically connected to each other at each end by a pad.

18. The semiconductor device according to claim 17, wherein the resistor segments are implanted with boron, borondifluoride, phosphorus, or arsenic implanted at a dose of 1E15 to 1E16 with an energy of 5 keV to 10.

* * * * *